United States Patent [19]

Nakao

[11] Patent Number: 5,589,700
[45] Date of Patent: *Dec. 31, 1996

[54] SEMICONDUCTOR NONVOLATILE MEMORY

[75] Inventor: Hironobu Nakao, Kyoto, Japan

[73] Assignee: Rohm Co., Ltd., Japan

[*] Notice: The term of this patent shall not extend beyond the expiration date of Pat. No. 5,319,230.

[21] Appl. No.: 203,698

[22] Filed: Feb. 28, 1994

Related U.S. Application Data

[63] Continuation of Ser. No. 844,803, Mar. 2, 1992, abandoned.

[30] Foreign Application Priority Data

Aug. 20, 1991 [JP] Japan ................................ 3-208058

[51] Int. Cl.⁶ ........................................... H01L 29/792
[52] U.S. Cl. .......................... 257/325; 257/410; 257/411
[58] Field of Search ................................. 257/325, 411, 257/410, 639, 649

[56] References Cited

U.S. PATENT DOCUMENTS 5,319,230   6/1994   Nakao ................................ 257/325

FOREIGN PATENT DOCUMENTS 8204162   11/1982   WIPO ................................ 257/325

OTHER PUBLICATIONS

DiMaria, D. J., Ghez, R. and Dong, D. W., "Charge trapping studies in $SiO_2$ using current injection form Si–rich $SiO_2$ Films", J. Appl. Phys. 51(9), Sep. 1988.

*Primary Examiner*—Mark V. Prenty
*Attorney, Agent, or Firm*—Ron Fish; Falk, Vestal & Fish

[57] ABSTRACT

A semiconductor nonvolatile memory comprised of a p-type silicon substrate 3, an $n^+$ drain 5 and an $n^+$ source 9, the source and the drain regions defining an MOS channel region 7. On top of the channel region 7 there are laminated a silicon dioxide film 18 and a semiconductor rich oxide film 20 which has been nitrided so as to leave silicon nitride region therein. Further on top of these layers, there is formed a polysilicon film 22, which is etched to form a control electrode. By using the memory cell and appropriate select transistors, a semiconductor nonvolatile memory (EPROM) is constructed.

3 Claims, 10 Drawing Sheets

SEMICONDUCTOR NONVOLATILE MEMORY

This is a file wrapper continuation application of a U.S. patent application Ser. No. 07/844,803, filed Mar. 2, 1992 for: SEMICONDUCTOR NONVOLATILE MEMORY, (now abandoned).

BACKGROUND OF THE INVENTION

1. Field of the Invention

The present invention relates to semiconductor nonvolatile memory and, more particularly, to reduction of the applied write voltage in such memories.

2. Description of the Prior Art

For trapping electric charge permanently, a new technique has been reported which utilizes a structure wherein thin, silicon-rich, silicon dioxide layers are deposited on top of silicon dioxide film (D. J. DiMaria et al.: J. Appl. Phys., 51(9) September 1980, 4830–4841).

The above method can be used for nonvolatile semiconductor memory cells. FIG. 1 schematically illustrates in section the construction of a prior art memory cell 1 utilizing the method mentioned above.

Referring to FIG. 1, a channel region 7 is formed from an $n^+$ drain 5 and an $n^+$ source 9 provided within a p-type silicon substrate 3. On top of the channel region 7 there are formed a gate oxide comprised of a thin silicon dioxide film 16 (approx. 8 nm thick or more) with a silicon-rich silicon dioxide film 12 formed on top of oxide layer 16. Further on top of layer 12 and 16 there is formed an aluminum gate electrode 14.

The memory cell 1 constructed as described above has two stable information states: one in which a logic "0" has been written therein wherein electrons are trapped in silicon regions 13 within the silicon-rich silicon dioxide film 12, and the other in which the logic "0" has been erased and a logic "1" has been stored, wherein electrons are not trapped in the silicon regions 13 within the silicon-rich silicon dioxide film 12. The fact that the memory cell 1 can take the two stable information states is utilized for fabrication of a memory.

Operations of writing and erasing information into and from the aforementioned memory cell 1 are now described with reference to the hysteresis loop as shown in FIG. 2. The horizontal axis in FIG. 2 represents gate voltage $V_g$, and the vertical axis represents threshold voltage $V_{th}$. The gate voltage $V_g$ is the voltage applied to the gate electrode 14 of the memory cell relative to the source 9. The threshold voltage $V_{th}$ is a gate voltage at which a current begins to flow between the source 9 and the drain 5 when the voltage applied to the gate electrode relative to the source 9 is made to increase. In this case, the threshold voltage $V_{th}$ is given by $$V_{th} = 2\phi F + V_{FB} + \frac{1}{C} \times \sqrt{2\epsilon q N_A 2\phi F}$$

where E is silicon dielectric constant, $N_A$ is the concentration of doping impurities within the substrate, $V_{FB}$ is the flat band voltage, C is the capacitance of the gate insulating film, q is the quantity of electron charge, and $\phi F$ is the Fermi level (i.e. the potential of an intrinsic semiconductor from Fermi level).

When a logic "0" is to be written into the memory cell 1, a high voltage which may be as high as approximately 20 volts is applied to the gate electrode 14 of the memory cell 1. As a result of application of this voltage, an electric field develops between the gate electrode 14 and the channel region 7 which causes the electrons within the channel region 7 to have high potential energy. As a result, some of the electrons tunnel through the silicon dioxide film 16 and enter the silicon regions 13 within the silicon-rich, silicon dioxide film 12 and are thus trapped. Such a change in the total charge within film 12 causes the threshold voltage to increase to approximately 1.6 V (see Q1 in FIG. 2). This means that the memory cell 1 has been made to serve as an enhancement mode transistor having a threshold voltage of approximately 1.6 V. In addition, the threshold voltage will remain as it is even if the gate voltage is cut off (see R1 in FIG. 2).

On the other hand, to erase the logic "0", it is necessary to force the trapped electrons to return to the channel region 7. This is effected by generating an electric field of the opposite polarity to that produced when writing the logic "0" by applying a voltage of approximately 20 V to the channel region 7. The resulting change in trapped charge in layer 13 causes the threshold voltage to change from some 1.6 V to some –0.6 V (see S1 in FIG. 2). This means that the memory cell 1 has been made to serve as a depletion mode transistor having a threshold voltage of approximately –0.6 V. This is the stable state wherein a logic "0" is erased and the memory cell 1 has stored a logic "1". In addition, the threshold voltage will remain as it is even if the gate voltage is cut off (see T1 in FIG. 2).

Next the operation of reading information from the memory cell 1 will be described. It is decided whether a logic "0" is stored or a logic "1" is stored in each memory cell by determining whether or not current flows through the channel region 7 when a voltage of some 5 V is applied between the source 9 and the drain 5 of the memory cell 1 and no gate voltage is applied to gate 14. In other words, when a logic "1" is stored, the threshold voltage of the memory cell 1 is at a negative value, as described above. Accordingly, since the memory cell 1 then is a depletion mode transistor, and the applied gate voltage of 0 volts exceeds the threshold voltage of –0.6 volts there flows a current through the channel region 7. Meanwhile, when a logic "0" is stored, the threshold voltage of the memory cell 1 is at a positive value. Accordingly, since the memory cell 1 is then an enhancement mode transistor, the channel region 7 is non-conductive because the applied gate voltage is 0 volts and the threshold voltage is +2.6 volts. Thus no current flows through the channel region 7.

A semiconductor nonvolatile memory may be constructed by using memory cells such as described above coupled with read and write control transistor.

With progress of the semiconductor industry, the need for integrated nonvolatile semiconductor memories has arisen. Semiconductor nonvolatile memories using the conventional memory cells 1 described above have had difficulties in further integration thereof, as described below.

When a voltage is applied to the aforementioned memory cell 1 to write information therein by trapping electrons in the silicon regions 13 within the silicon-rich silicon dioxide film 12, there is a requirement that the region 11 sandwiched between the gate electrode 14 and the channel region 7 has an insulating property more than a specific level. However, since the silicon regions 13 within the silicon-rich silicon dioxide film 12 act as conductive material, the silicon-rich silicon dioxide film 12 would be insufficient as an insulator on the whole. Therefore, to enhance the insulating property of the region 11 sandwiched between the gate electrode 14 and the channel region 7, it has been required to arrange the silicon dioxide film 16 so as to be thicker than a specific level. With this thicker film, for electrons to tunnel through the silicon dioxide film 16, a high voltage as much as 20 V or so was necessary. The use of such a high write voltage requires a highly insulated structure to avoid destruction of the device caused by voltage breakdown. This has unduly restricted the degree of integration.

SUMMARY OF THE INVENTION

Accordingly, an object of the present invention is to provide a nonvolatile semiconductor memory that allows information to be written therein at low voltage so that the miniaturization and integration of the nonvolatile semiconductor memory can be facilitated.

A nonvolatile memory according to an embodiment of the invention, comprises:

a first conductive type semiconductor region;

a pair of second conductive type diffusion regions formed within the first conductive type semiconductor region;

an insulating layer formed on the first conductive type semiconductor region;

a semiconductor rich oxide layer formed on the insulating layer, the semiconductor rich oxide layer having at least a nitride semiconductor region formed therein, and a control electrode formed on the semiconductor rich oxide layer.

A method for manufacturing nonvolatile memories according to an embodiment of the invention, comprises the steps of:

preparing a substrate of semiconductor monocrystala having a first conductive type semiconductor region;

forming an insulating layer by oxidation on the substrate;

depositing a semiconductor rich oxide layer having on the insulating layer and nitriding the semiconductor rich oxide layer;

growing a control electrode layer on the top of the nitrided semiconductor rich oxide layer;

etching the control electrode layer using a resist pattern as a mask to form a control electrode; and forming a pair of second conductive type diffusion regions within the first conductive type semiconductor region by diffusing a second conductive type dopant.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
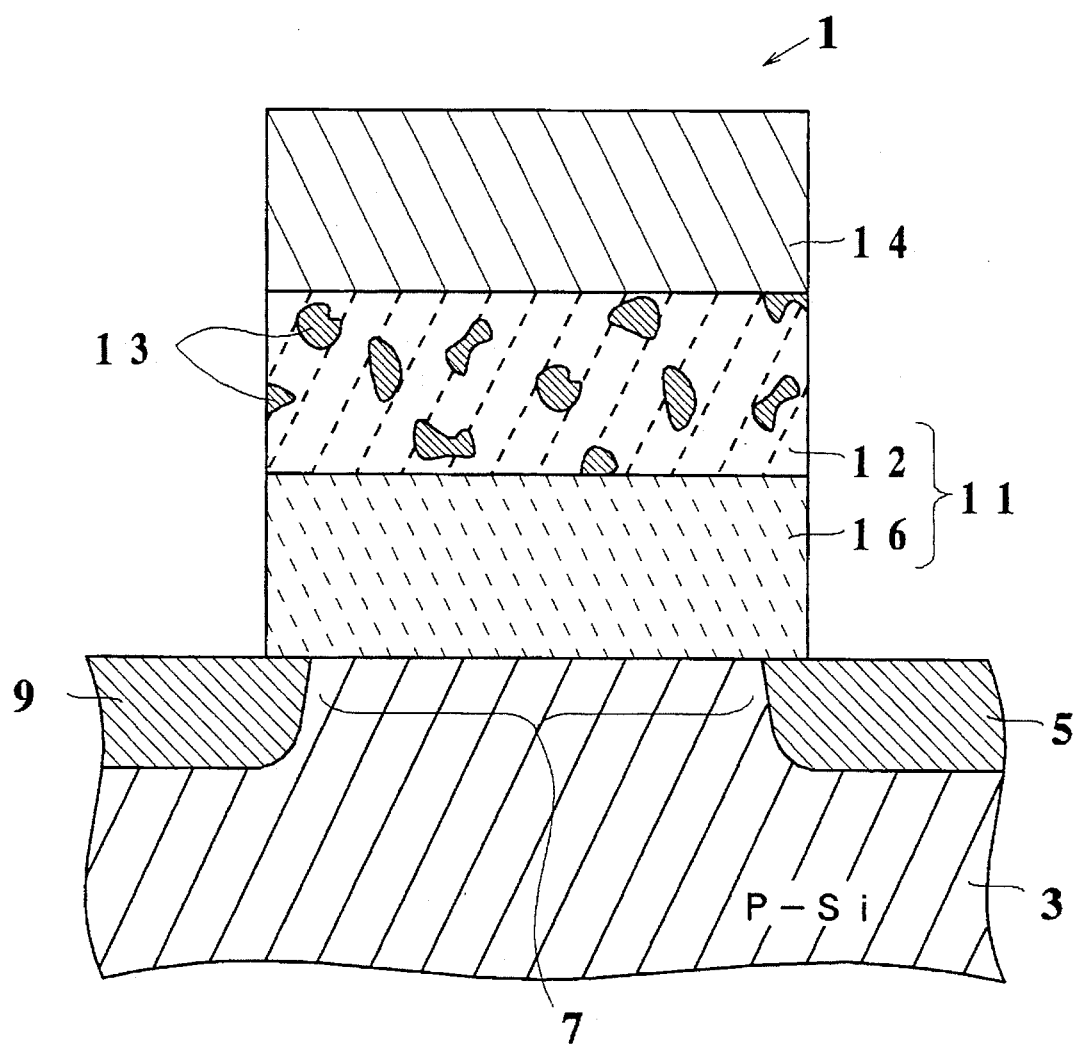
FIG. 1 is a view schematically showing the construction in section of a conventional memory cell 1.
Figure 2:
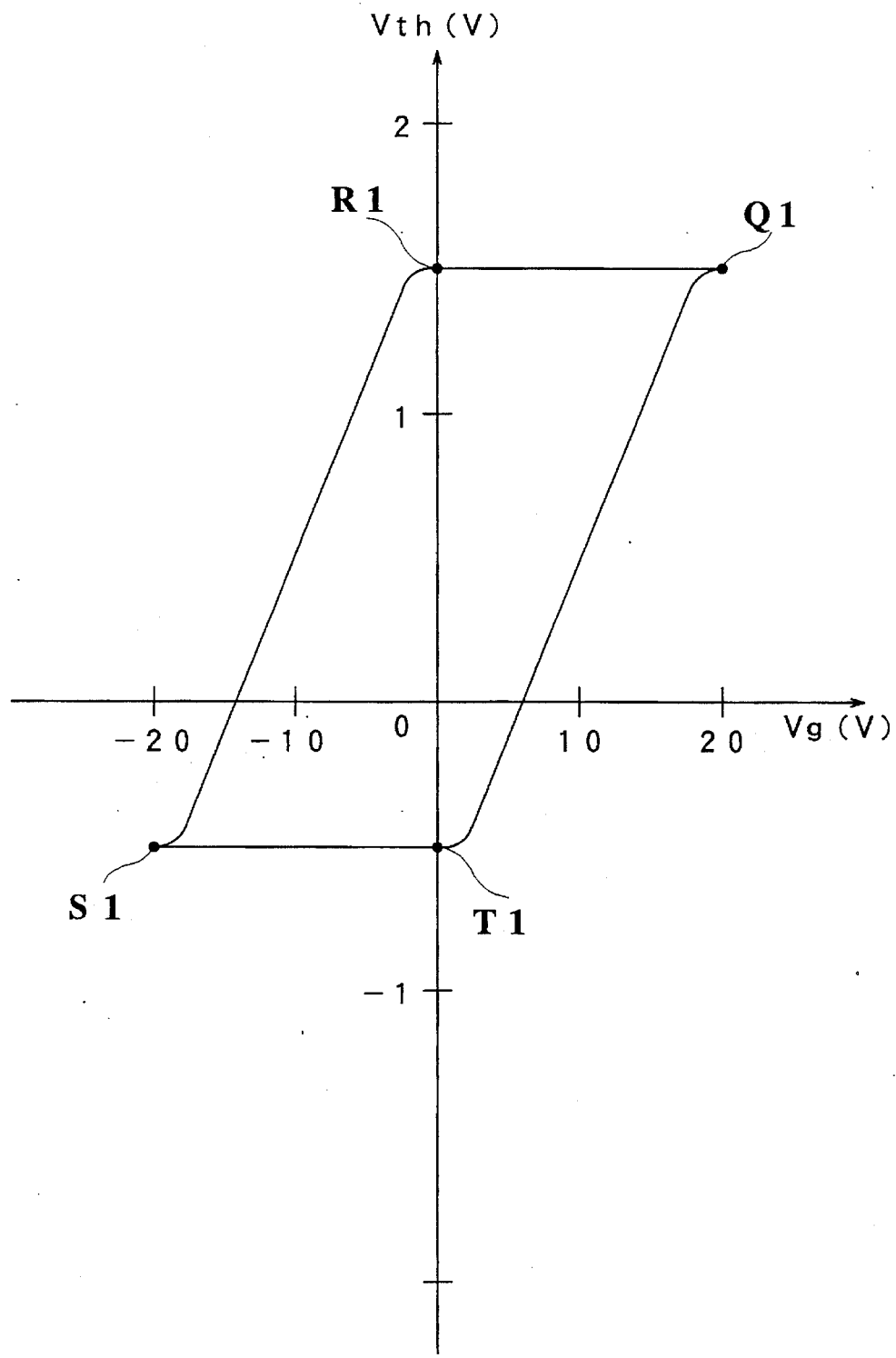
FIG. 2 is a view showing the threshold voltage hysteresis loop of the memory cell 1.
Figure 3:
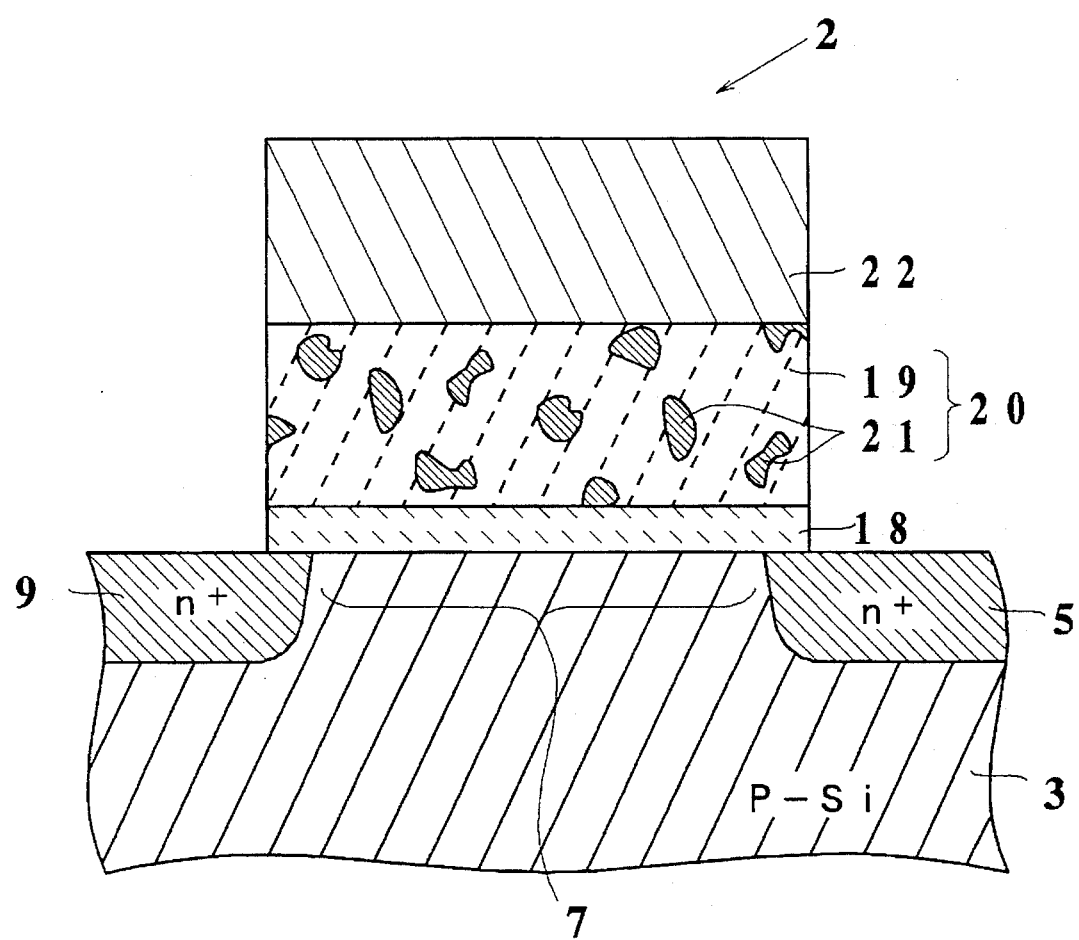
FIG. 3 is a view showing the construction in section of a memory cell 2 according to an embodiment of the present invention.

Illustrated in FIG. 3 is a schematic in section of a memory cell 2 of a nonvolatile semiconductor memory according to an embodiment of the present invention.

A p-type silicon substrate 3 comprised of a first conductive type semiconductor substrate has formed therein an $n^+$ drain 5 comprised of a second conductive type diffusion region, and an $n^+$ source 9 formed in the same way. The two source and drain regions define a channel region 7 therebetween in the substrate. On top of the channel region 7 there are laminated a thin silicon dioxide film 18 that is an insulating layer (approximately 2.5 nm thick) serving as a gate oxide, and a charge trapping region 20 comprised of a plurality of silicon nitride regions formed within a silicon dioxide layer which is formed on top of and in electrical contact with the gate oxide layer 18. That is, the charge trapping layer 20 is formed of an silicon dioxide oxide Insulation layer in which nitride semiconductor pockets comprised of silicon nitride regions 21 are formed, each said silicon nitride region 21 being surrounded by silicon dioxide material 19. A polysilicon film 22 serving as a control electrode is formed on top of layer 19.

Figure 4:
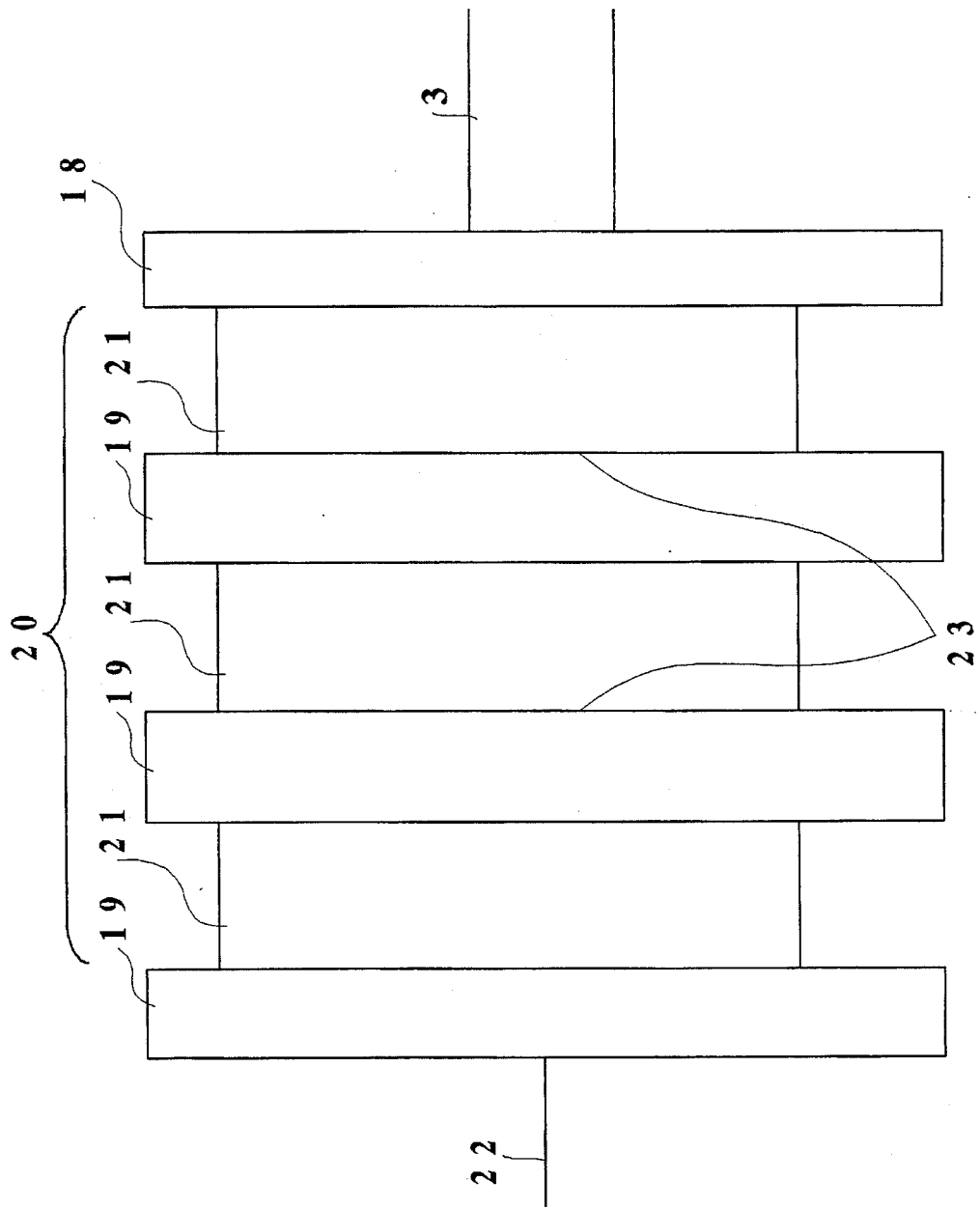
FIG. 4 is a view showing the construction of the memory cell 2 by way of band view.

The structure of the memory cell 2 can be illustrated in the form of band view as shown in FIG. 4. The memory cell 2 constructed as above has two stable states: a first state in which a logic "0" is stored wherein electrons are trapped in silicon nitride regions 21 within the silicon-rich silicon dioxide film 20, and a second state in which the logic "0" has been erased and a logic "1" has been stored wherein electrons are not trapped in the silicon nitride regions 21 within the silicon-rich silicon dioxide film 12. These two stable states are utilized to implement a memory.

To write a logic "0" into the memory cell 2, a voltage of approximately 8 V is applied to control electrode 22 of the memory cell 2. As a result of application of this write voltage, an electric field develops between the control electrode 22 and the channel region 7 which causes the electrons within the channel region 7 to have high potential energy. As a result, some of the electrons tunnel through the silicon dioxide film 18. The electrons which tunnel through layer 18 move into the silicon-rich silicon dioxide film 2, and become trapped in silicon nitride regions 21 within the silicon-rich silicon dioxide film 20. When electrons are trapped by the silicon nitride regions 21, a logic "0" has been written into the memory cell 2.

On the other hand, to write a logic "1", it is necessary to make the trapped electrons return to the channel region 7. To do this, a voltage of some 8 V is applied to the channel region 7 so that an electric field is generated in the direction opposite (opposite polarity) to the electric field applied in writing the stored information thereby making the trapped electrons return to the channel region 7.

Referring to FIG. 4, there is shown a band view of the memory cell 2. To write information, electrons charged with high energy due to an applied electric field are made to tunnel through the silicon dioxide film 18 whereupon they flow into the nitrided silicon-rich silicon dioxide film 20. Inside layer 20, the electrons move within the silicon dioxide region 19 within the silicon-rich silicon dioxide film 20 or into the silicon nitride regions 21, and are thus trapped in the plurality of silicon nitride regions 21. Due to the fact that there are a great number of interfaces 23 between the silicon dioxide region 19 and the silicon nitride regions 21, the resulting density of trapped electrons is high, and electrons are therefore efficiently trapped. By contrast, for erasing stored information, the trapped electrons are pulled by an electric field in the direction opposite to that used in writing information. These electrons tunnel through the silicon dioxide film 18 and return to the p-type silicon substrate 3.

Figure 5:
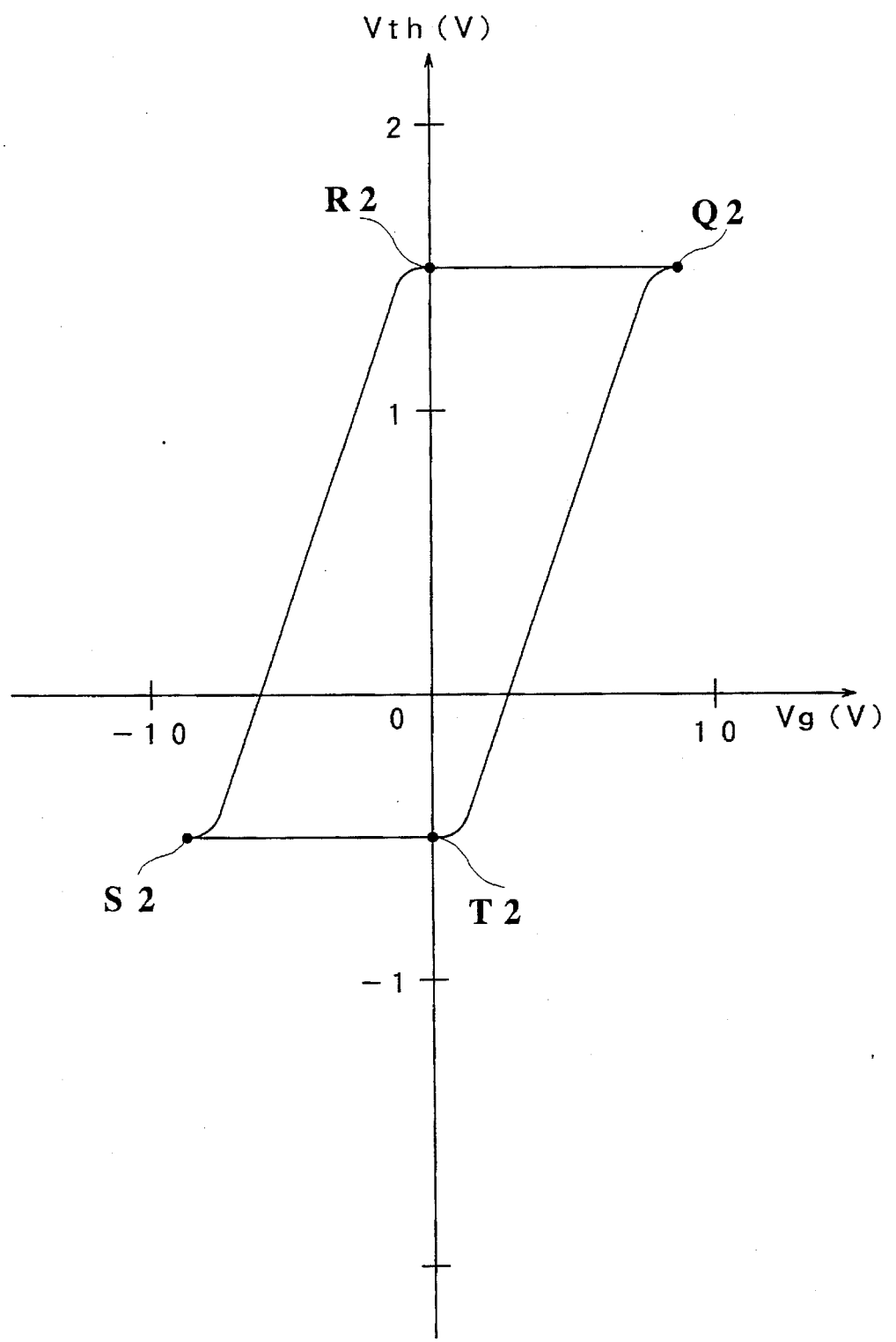
FIG. 5 is a view schematically showing the threshold voltage hysteresis loop of the memory cell 2.

The above-described state change is detailed below with reference to the hysteresis loop of the memory cell 2 shown in FIG. 5. In writing a logic "0" into the memory cell 2, a voltage is applied to the control electrode 22 thereby causing electrons to lie trapped in the silicon nitride regions 21. Such a change causes the threshold voltage to increase up to about 1.6 V (see Q2 in FIG. 5). This trapped charge and resulting raised threshold voltage cause the memory cell 2 to behave like an enhancement mode transistor having a threshold voltage of approximately 1.6 V. In addition, the threshold voltage will remain at approximately 1.6 volts as it is even if the voltage on electrode 22 is cut off (see R2 in FIG. 5).

To erase a stored logic "0" and store a logic "1", an electric field is applied in the direction opposite to that used in writing information thereby making the electrons return to the channel region 7. This change causes the threshold voltage to change from about 1.6 V to about −0.6 V (see S2 in FIG. 5). This means that the memory cell 2 has been made to behave like a depletion mode transistor having a threshold voltage of −0.6 V. In addition, the threshold voltage will remain as it is at about −0.6 volts even if the gate voltage on electrode 22 is cut off (see T2 in FIG. 5).

Referring next to the process of reading information stored in the memory, it may be determined whether a logic "1" or a logic "0" is stored in the memory cell 2 by determining whether current flows through the channel region 7 when a voltage is applied between the source 9 and the drain 5 of the memory cell 2 with no gate voltage applied to the doped polysilicon electrode 22.

More specifically, when a logic "1" is stored, the threshold voltage of the memory cell 2 is at a negative value of approximately −0.6 V, as described above. Since the memory cell 2 behaves like a depletion mode transistor in this state, the channel region 7 is conductive. As a result, a current flows through the channel region 7. By contrast, when a logic "0" is stored, the threshold voltage of the memory cell 2 is at a positive value of approximately 1.6 V. Accordingly, the memory cell 2 behaves like an enhancement mode transistor, and the channel region 7 is non-conductive because no gate voltage is applied and the threshold voltage is not exceeded. As a result, no current flows through the channel region 7.

Next, an example of an LSI memory constructed using the aforementioned memory cell 2 will be given. First described is the principle of operation involved when information is written.

Figure 6:
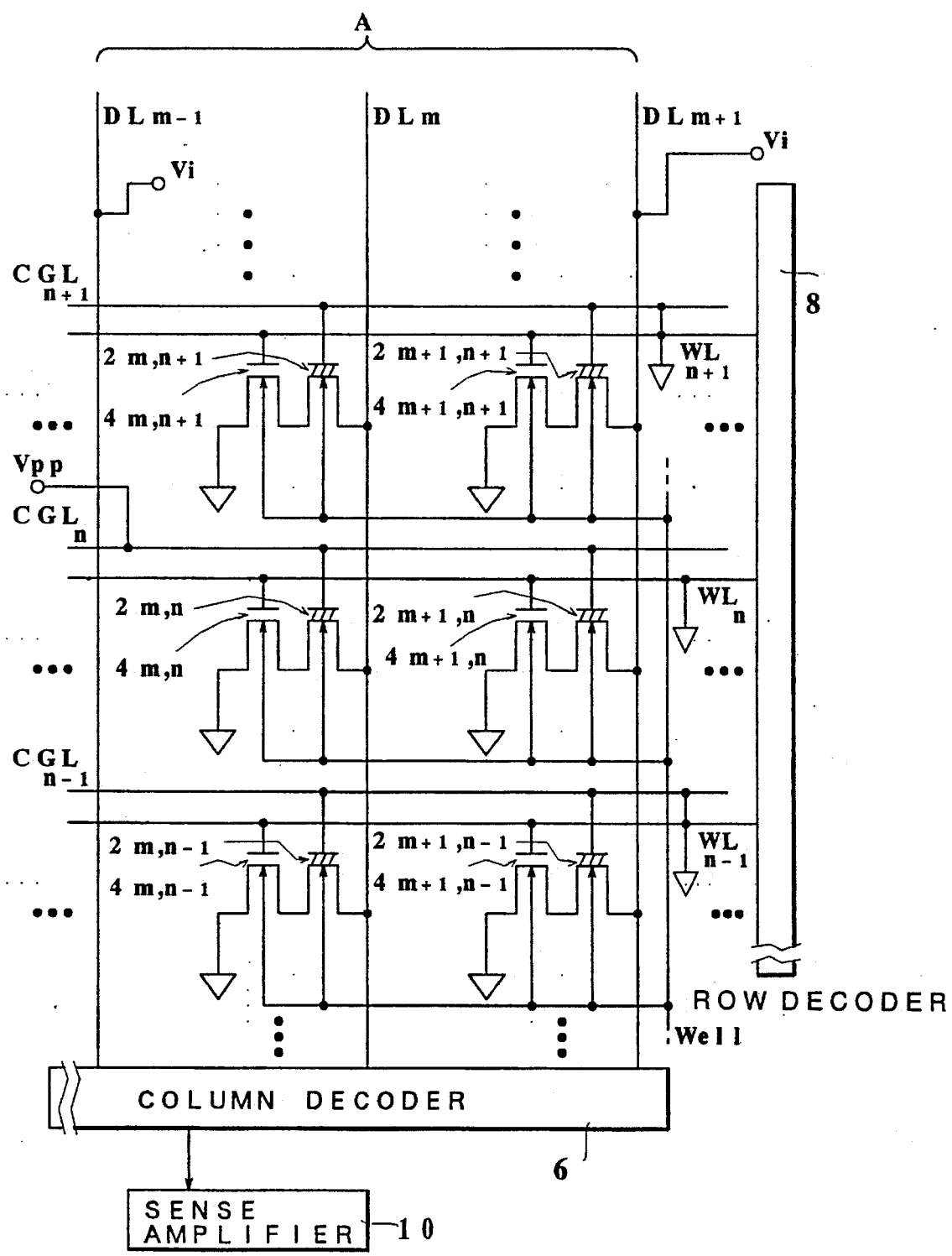
FIG. 6 is a conceptual view showing the construction of an LSI memory for explaining the principle of writing information into memory cells according to an embodiment of the present invention.

A conceptual view of the construction of a 1024-bit memory LSI is shown in FIG. 6.

A memory cell array A has 32 by 32, i.e. 1024 memory cells (1K bits) arranged in matrix form. To the source 9 of each memory cell 2 is connected the drain of row select transistor. A row decoder 8 drives word lines WL which are each connected to the gate electrode of each row select transistor 4. Control gate lines CGL are each connected to the control electrode 22 of each memory cell 2 to assist in writing data into the array. A column decoder 6 drives column data lines DLs which are each connected to the drain 5 of each memory cell 2. To the p-type silicon substrate 3 is connected a well line Well.

Now the way in which information is written into a memory cell $2_{m,n}$ will be described. To write information into a memory cell at column m and row n, a programming voltage $V_{pp}$ is applied to the control gate line $CGL_n$. To the data lines other than the data line $DL_m$, a programming inhibit voltage $V_i$ is applied by the column decoder 6. To the word line $WL_n$, ground voltage equal in potential to the substrate is applied. Therefore, of all the memory cells 2 connected to the control gate line $CGL_n$ to which the programming voltage $V_{pp}$ is applied, only the memory cell $2_{m,n}$ at column m and row n has the proper potentials applied at drain, source, gate and substrate to program data therein. This is because the memory cell $2_{m,n}$ is connected to the data line $DL_m$, which is only data line to which the programming inhibit voltage $V_i$ is not applied. As a consequence, the electric field effect caused by the programming voltage $V_{pp}$ acts only on the memory cell $2_{m,n}$, thereby causing the electrons within the channel region to be trapped in the silicon nitride regions 21 within the silicon-rich silicon dioxide film 20. In this manner, a logic "0" is written only into the memory cell $2_{m,n}$.

Figure 7:
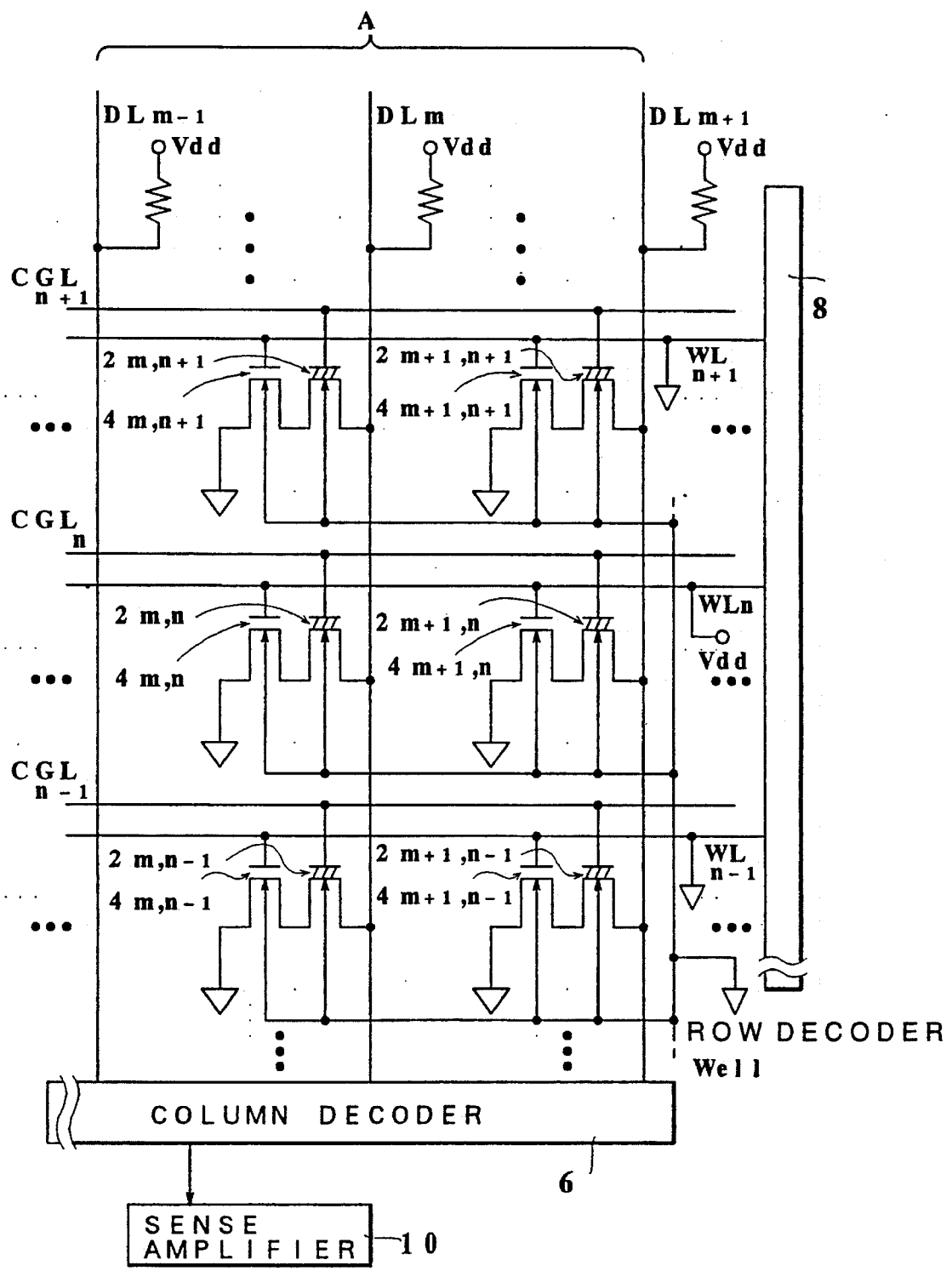
FIG. 7 is a conceptual view showing the construction of an LSI memory for explaining the principle of reading information from memory cells according to an embodiment of the present invention.

The principle of operation for reading information from the memory cell $2_{m,n}$ is described below with reference to FIG. 7. The construction shown in FIG. 7 is the same as shown in FIG. 6. To read data, a voltage $V_{dd}$ is applied only to the word line $WL_n$ by the row decoder 8. The voltage $V_{dd}$ is also applied via a resistor 30 to all the data lines DL. In this state, since the channel region 7 of the memory cell $2_{m,n}$ in which a logic "0" is stored is non-conductive, as mentioned before, the current flowing through data line $DL_m$ is not conducted to ground through cell $2_{m,n}$ and its select transistor and, therefore, it is injected into the column decoder 6 without loss to ground.

Conversely, when the memory cell $2_{m,n}$ has a logic "1" stored therein its the channel region 7 is conductive. Since the voltage $V_{dd}$ is also applied to the gate electrode of the row select transistor $4_{m,n}$ (that is the row select transistor $4_{m,n}$ is in the ON state), the current flowing through each data line $DL_m$ is directed to ground via the conductive memory cell $2_{m,n}$ and the channel of the row select transistor $4_{m,n}$. As a result, the column decoder 6 has no input of current from the data line DL.

The column decoder 6 is arranged to put out only the current from the data line $DL_m$. This output is amplified and read by the sense amplifier 10. Thus, only the data from the memory cell $2_{m,n}$ is read out.

Figure 8:
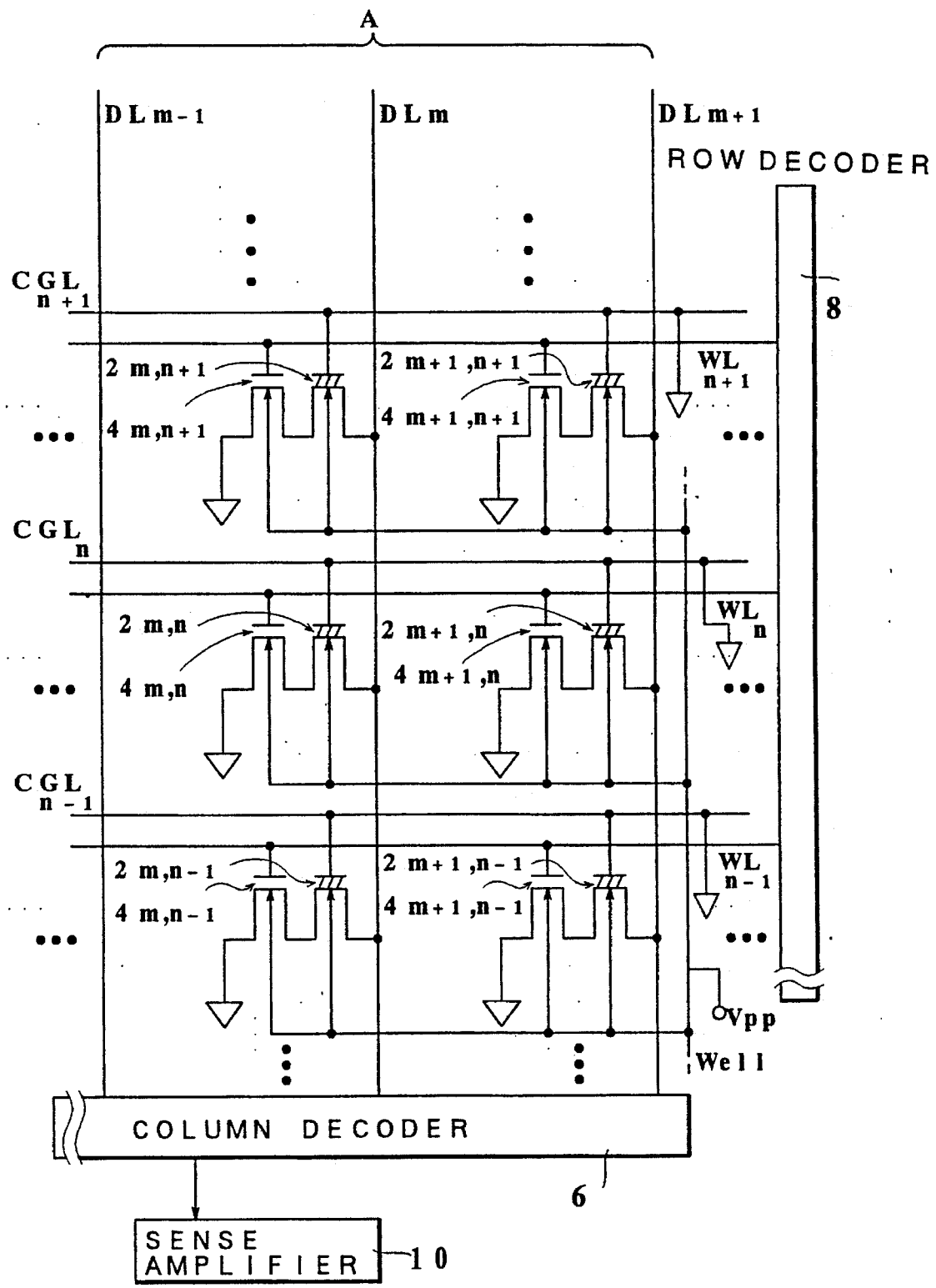
FIG. 8 is a conceptual view showing the construction of an LSI memory for explaining the principle of erasing information stored in memory cells according to an embodiment of the present invention.

Next, process of batch erasing of information stored in the aforementioned 1024-bit memory LSI is described with reference to FIG. 8. The construction in shown in FIG. 8 is the same as shown in FIG. 6. With each control gate lines CGL grounded, a programming voltage $V_{pp}$ is applied to the p-type silicon substrate 3 of each memory cell 2 via the well line Well. At this point, the electrons trapped in region 20 of FIG. 3 return to the channel region 7 under the influence electric field caused by the erase voltage applied to the well line. In consequence, all the stored logic "0s" are erased and, all the memory cells 2 have logic "1s" stored therein.

The manufacturing process for the memory cells 2 having the construction as described above is described below with reference to FIGS. 9A to 9D.

Figure 9A:
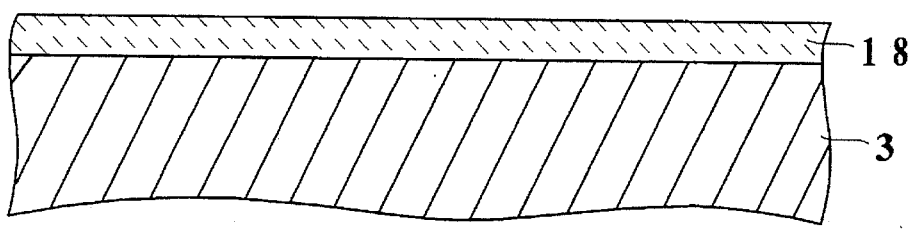
FIGS. 9A through 9D are views showing the manufacturing process of the memory cell 2.
Figure 9B:
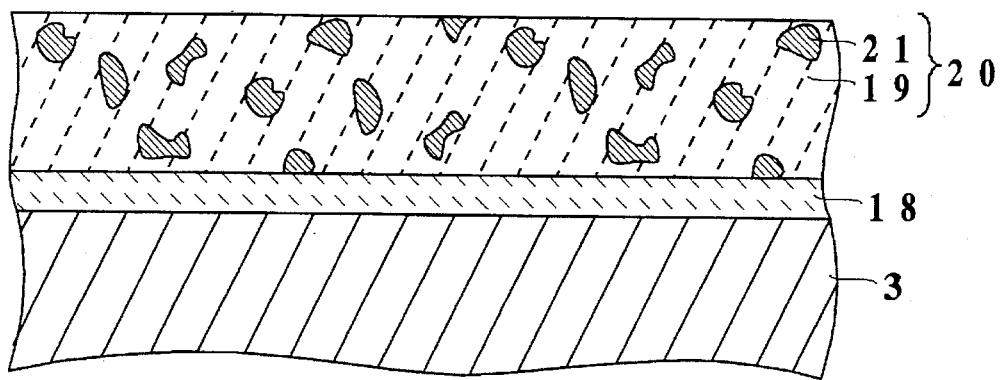
Figure 9C:
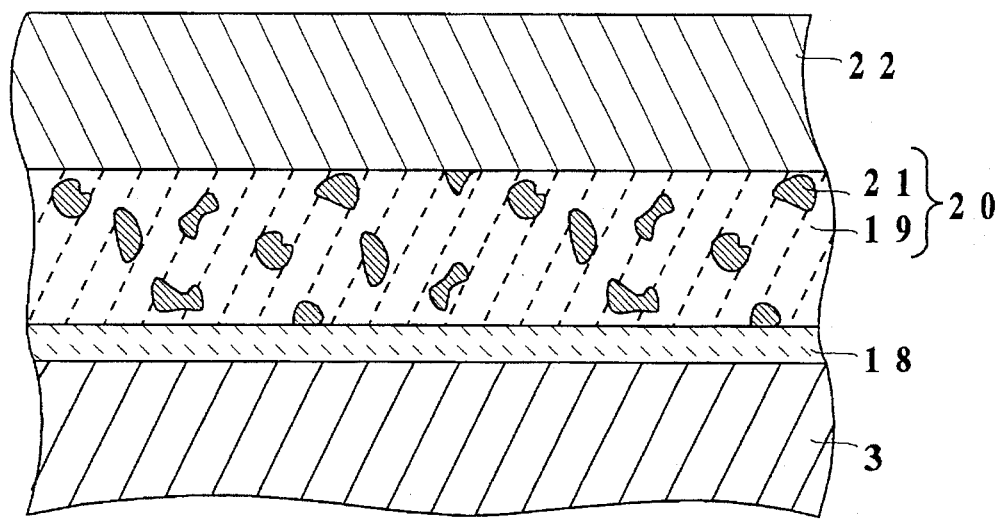
Figure 9D:
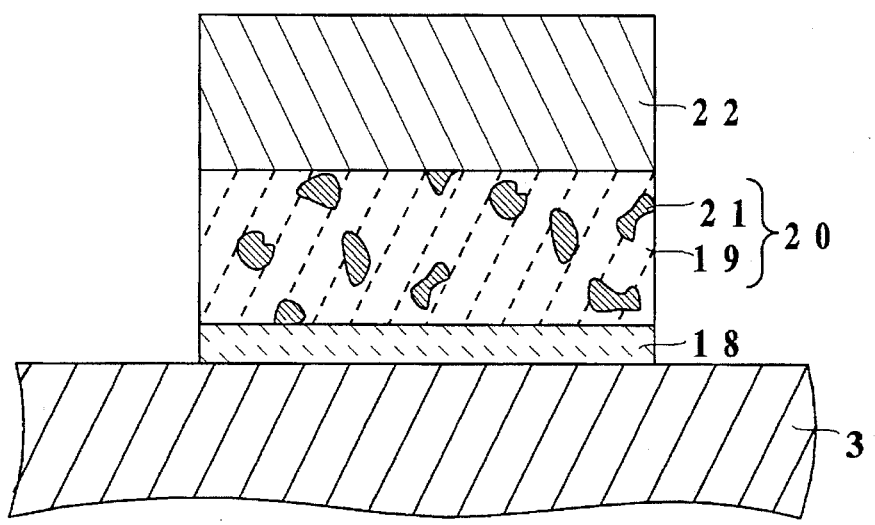

With a thin-film p-type silicon substrate 3 prepared, a silicon dioxide film 18 is formed on top of the p-type silicon substrate 3 by thermal oxidation (FIG. 9A). Then a silicon-rich silicon dioxide film 20 is deposited on top of the silicon dioxide film 18 using monosilane and $N_2O$ in their ratio of 2:1 to 1:1 by the CVD method and is nitrided by an annealing treatment in an ammonia atmosphere so as to form silicon nitride regions 21 within the layer 20 (FIG. 9B). Thereafter, a polysilicon film 22 is grown on the top of the silicon-rich silicon dioxide film 20 by the CVD method (FIG. 9C). The result is then subjected to etching using resist as a mask thereby forming the polysilicon film 22, the silicon-rich silicon dioxide film 20, and the silicon oxide film 18 (FIG. 9D) into the gate structure shown in FIG. 3 over lying channel 7. Next, arsenic or phosphorus is ion-implanted and thermally diffused, thereby forming an $n^+$ drain 5 and an $n^+$ source 9 (FIG. 3). As a result of this step, a channel region 7 is formed between the $n^+$ drain 5 and the $n^+$ source 9.

In addition, although the first conductive type has been assumed to be p-type and the second to be n-type in the above embodiment, in alternative embodiment, the first conductive type is n-type and the second is p-type.

The nonvolatile semiconductor memory according to the present invention is characterized in that the semiconductor region within the foregoing silicon rich silicon dioxide film 20 has been nitrided, thus allowing the silicon-rich silicon dioxide film 20 to be increased in its insulating characteristic on the whole.

Therefore, it is possible to use thinner insulating films on the foregoing substrate. This leads to writing information into the memory cells at a lower write voltage.

Furthermore, it is also possible to facilitate the miniaturization of the semiconductor nonvolatile memory cells as well as to enhance the degree of integration thereof because of the loss sever breakdown voltage requirements at the lower programming voltage enabled by the thinner allowable insulating film.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device including a nonvolatile memory, comprising:

a first conductivity type semiconductor region;

a pair of second conductivity type diffusion regions formed within said first conductivity type semiconductor region;

an insulating layer formed on said first conductivity type semiconductor region;

a charge trapping layer comprising a plurality of silicon nitride regions formed within a silicon dioxide layer, said charge trapping layer formed on said insulating layer, and a control electrode formed on said charge trapping layer.

2. A semiconductor device including a nonvolatile memory according to claim 1, wherein said pair of second conductivity type diffusion regions are source and drain regions, so that an MOS channel may be formed between the source and the drain regions under predetermined voltage conditions, and wherein charges may be trapped in said charge trapping layer under predetermined voltage conditions thereby altering the threshold voltage of said MOS channel such that data may be stored in nonvolatile manner in said memory.

3. A semiconductor device including a nonvolatile memory, comprising:

a first conductivity type semiconductor substrate region;

a pair of second conductivity type diffusion regions formed within said first conductivity type semiconductor substrate region;

a gate oxide insulating layer formed on said first conductivity type semiconductor substrate region;

a charge trapping layer comprising silicon nitride regions formed within a silicon dioxide layer, said charge trapping layer formed on said gate oxide insulating layer and in electrical contact therewith;

a control electrode formed on said charge trapping layer.

* * * * *